United States Patent
Wang et al.

(10) Patent No.: US 8,137,999 B2
(45) Date of Patent: Mar. 20, 2012

(54) PACKAGE FOR A LIGHT EMITTING DIODE AND METHOD FOR FABRICATING THE SAME

(75) Inventors: Bily Wang, Hsin Chu (TW); Jonnie Chuang, Taipei Hsien (TW); Hui-Yen Huang, Hsin Chu (TW)

(73) Assignee: Harvatek Corporation, Hsin Chu (TW)

( * ) Notice: Subject to any disclaimer, the term of this patent is extended or adjusted under 35 U.S.C. 154(b) by 0 days.

(21) Appl. No.: 13/214,337

(22) Filed: Aug. 22, 2011

(65) Prior Publication Data

US 2011/0300649 A1    Dec. 8, 2011

Related U.S. Application Data

(63) Continuation of application No. 12/385,728, filed on Apr. 17, 2009.

(51) Int. Cl.
 *H01L 21/56* (2006.01)
(52) U.S. Cl. ............ 438/25; 438/38; 438/123; 438/126; 438/127; 257/E21.499; 257/E21.502; 257/E21.503
(58) Field of Classification Search ............... 438/25, 438/38, 123, 126, 127; 257/E21.499, 502, 257/503
See application file for complete search history.

(56) References Cited

U.S. PATENT DOCUMENTS

| | | | |
|---|---|---|---|
| 2003/0075724 A1* | 4/2003 | Wang et al. | 257/99 |
| 2006/0043401 A1* | 3/2006 | Lee et al. | 257/99 |
| 2006/0054912 A1* | 3/2006 | Murakami et al. | 257/99 |

* cited by examiner

*Primary Examiner* — Minchul Yang
(74) *Attorney, Agent, or Firm* — Rosenberg, Klein & Lee

(57) ABSTRACT

A method for fabricating a LED includes: providing a metal substrate; etching the metal substrate to form a first terminal, a second terminal, and a gap between the first terminal and the second terminal, wherein the first terminal has at least one first etching concave and the second terminal has at least one second etching concave; placing at least one LED chip in the at least one first etching concave, wherein the at least one LED chip has a first electrode and a second electrode; electrically connecting the first electrode with the first terminal, and electrically connecting the second electrode with the second terminal; and then covering the at least one LED chip with synthetic polymer, wherein the synthetic polymer is filled into the at least one first etching concave, the at least one second etching concave and the gap to connect the first terminal with the second terminal.

8 Claims, 11 Drawing Sheets

PACKAGE FOR A LIGHT EMITTING DIODE AND METHOD FOR FABRICATING THE SAME

CROSS REFERENCE TO RELATED APPLICATION

This application is a continuation application of U.S. application Ser. No. 12/385,728, filed on 7 Apr. 2009 and entitled "PACKAGE FOR A LIGHT EMITTING DIODE AND METHOD FOR FABRICATING THE SAME", now pending.

BACKGROUND OF THE INVENTION

1. Field of the Invention

The instant disclosure generally relates to a package for a light emitting diode (referred to as an "LED" hereinafter), and more particular to a LED package provided with a recess and a method for fabricating such a LED package.

2. Description of Related Art

Referring to FIG. 1, a conventional package for a LED comprises a substrate 100, a LED chip 103, and a housing 104. The substrate 100 has a first terminal 101 and a second terminal 102. The LED chip 103 is mounted on a top surface of the first terminal 101. The housing 104 caps the LED chip 103 and the substrate 100. The chip 103 is electrically connected with the first terminal 101 and the second terminal 102.

Referring to FIG. 2, another conventional package for a LED comprises a substrate 105, a first terminal 106, a second terminal 107, a LED chip 108, and a housing 109. The LED chip 108 is mounted on a top surface of the first terminal 106 of the substrate 105. The housing 109 caps the chip 108 and the substrate 105. The chip 108 is electrically connected with the first terminal 106 and the second terminal 107.

LEDs have been widely applied to car braking lights, LCD panels, outdoor color advertising signs and traffic lights. To meet the demanding requirements from these and other applications, there is a great demand for the size of LED packages to be reduced. However, according to the prior art, the sizes of conventional packages for LEDs are not satisfying since the chips 103 and 108 are mounted on the top surfaces of the first terminals 101 and 106 of the substrates 100 and 105, respectively.

Therefore, in view of the above drawbacks existing in the conventional LED packages, the inventor proposes the instant disclosure to overcome the above problems based on his deliberate research and related principles.

SUMMARY OF THE INVENTION

The object of the instant disclosure is to provide a package for a LED and a method for fabricating such a package. According to the instant disclosure, a metal substrate formed with a recess is obtained by etching, and a LED chip is arranged in the recess of the metal substrate. Therefore, a smaller package for a LED becomes possible.

In order to achieve the above object, the instant disclosure provides a method for fabricating a light emitting diode package, comprising the steps of: providing a metal substrate; etching the metal substrate to form a first terminal, a second terminal, and a gap between the first terminal and the second terminal, wherein the first terminal has at least one first etching concave concaved downwardly from the top surface thereof by etching, and the second terminal has at least one second etching concave concaved downwardly from the top surface thereof by etching and at least one protrusion pad being close to the at least one first etching concave and disposed in the at least one second etching concave, wherein the at least one first etching concave faces the at least one second etching concave, and the at least one first etching concave is communicated with the at least one second etching concave through the gap; placing at least one LED chip in the at least one first etching concave, wherein the at least one LED chip has a first electrode and a second electrode; electrically connecting the first electrode with the first terminal, and electrically connecting the second electrode with the top surface of the at least one protrusion pad of the second terminal by a conductive wire; and then covering the at least one LED chip with synthetic polymer, wherein the synthetic polymer is filled into the at least one first etching concave, the at least one second etching concave and the gap to connect the first terminal with the second terminal.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure

DETAILED DESCRIPTION OF THE PREFERRED EMBODIMENTS

Figure 1:
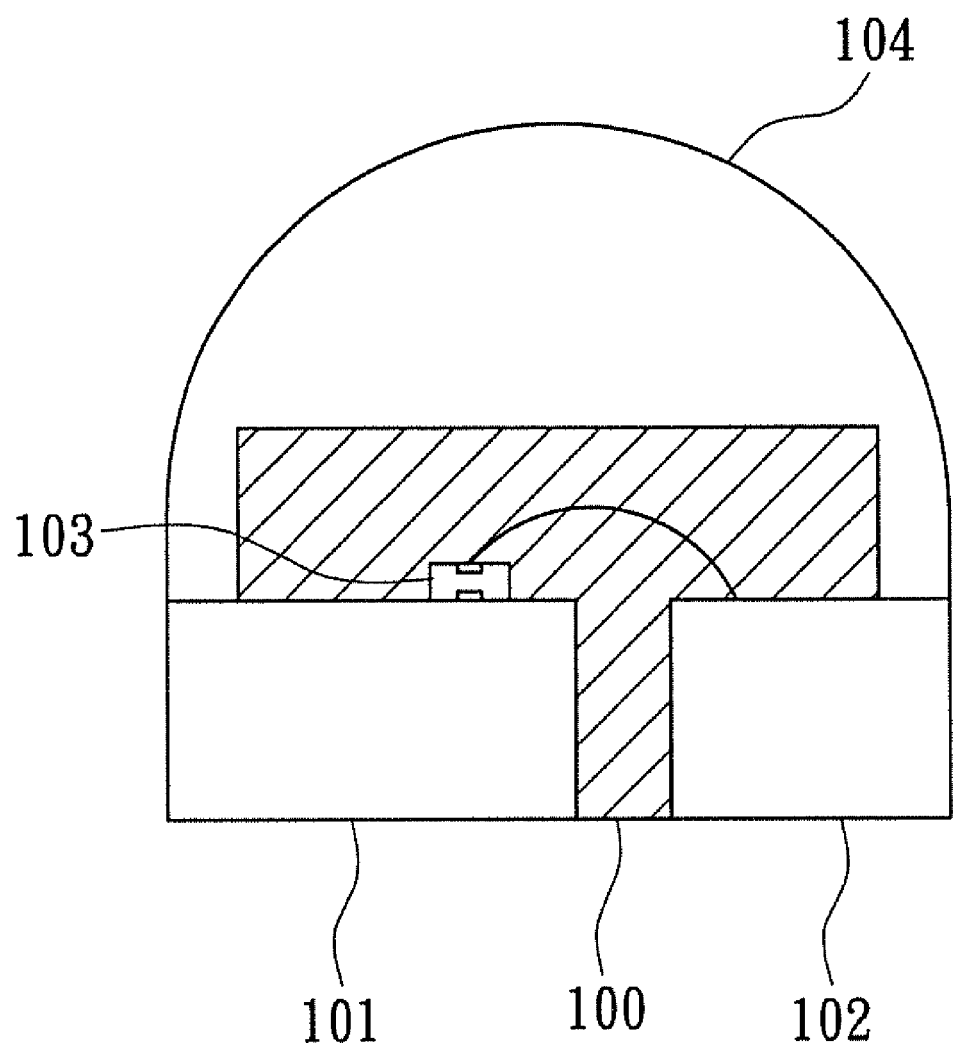
FIG. 1 is a cross-sectional view of a conventional package for a LED chip according to the prior art.
Figure 2:
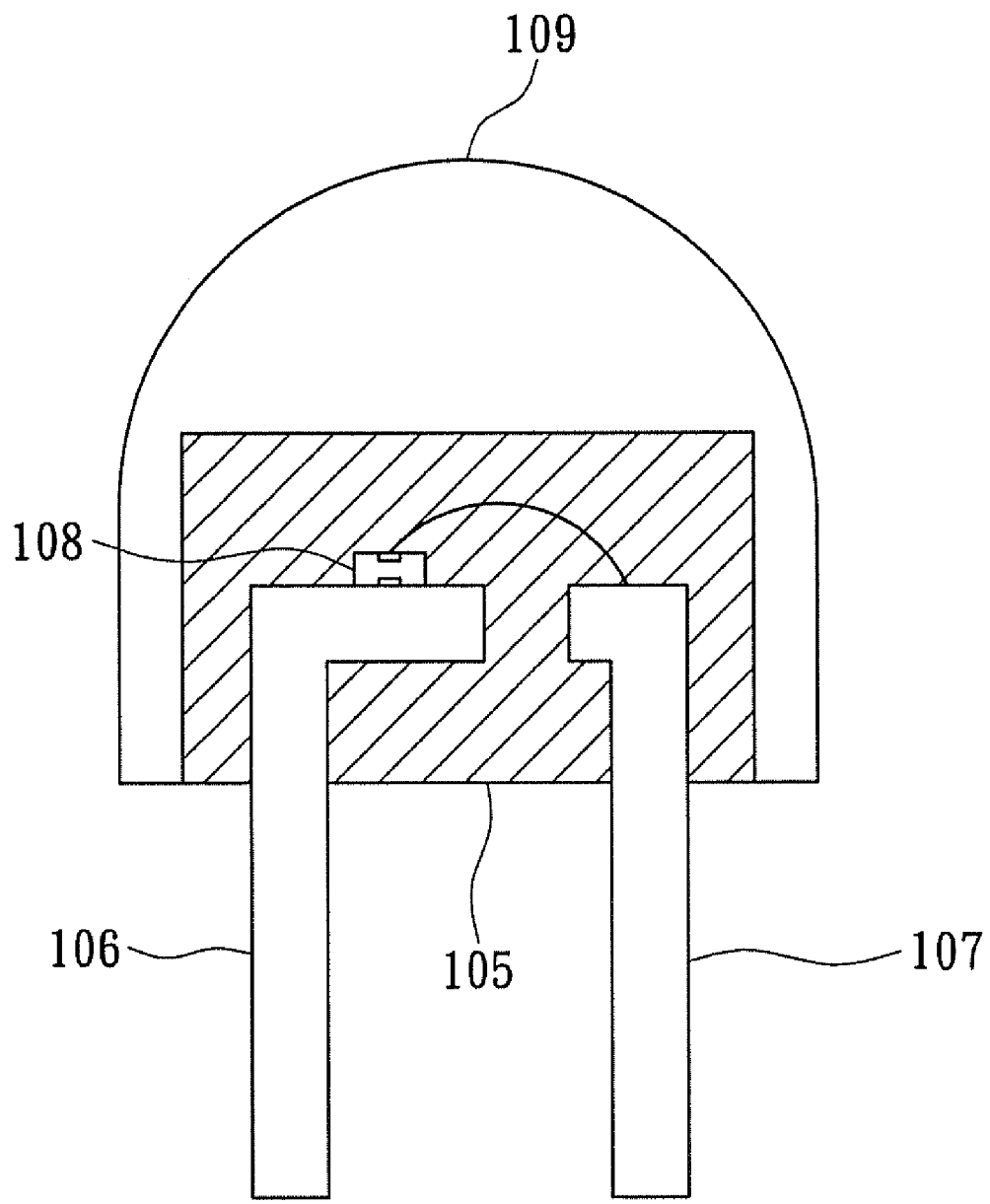
FIG. 2 is a cross-sectional view of a conventional package for a LED chip according to another prior art.
Figure 3:
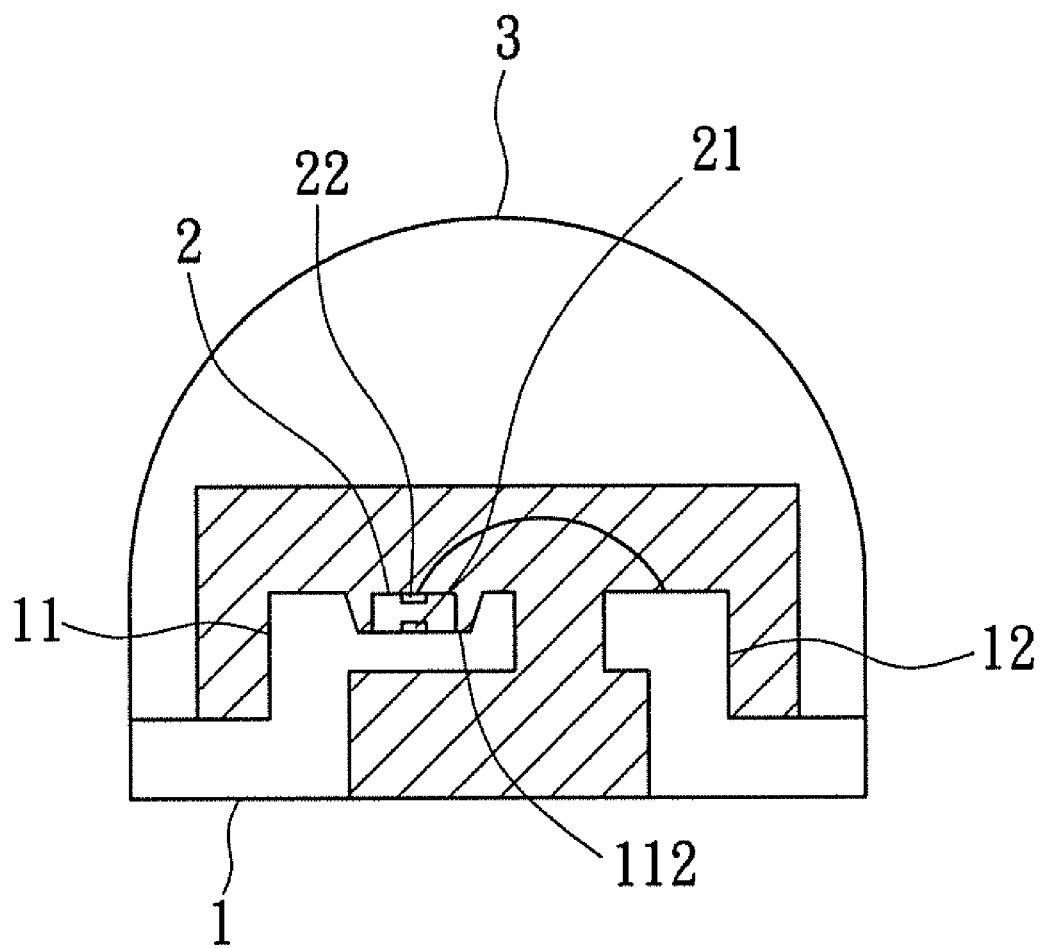
FIG. 3 is a cross-sectional view of a package for a LED chip according to the instant disclosure.

Referring to FIG. 3, a package for a LED chip comprises a metal substrate 1, at least one LED chip 2 and an insulative housing 3, according to the instant disclosure. The metal substrate 1 has a first terminal 11 and a second terminal 12. The first terminal 11 is formed with a recess 112 of any possible shape. The LED chip 2 is arranged in the recess 112 of the first terminal 11 and it has a first electrode 21 and a second electrode 22. The first electrode 21 and the second electrode 22 may be arranged on the top surface and the bottom surface of the LED chip 2, respectively. Alternatively, both the first electrode 21 and the second electrode 22 may be arranged in a top surface of the LED chip 2. The first electrode 21 and the second electrode 22 are electrically connected with the first terminal 11 and the second terminal 12 of the metal substrate 1. The insulative housing 3 caps the LED chip 2 and the metal substrate 1, and it is substantially a light converging element.

Figure 4A:
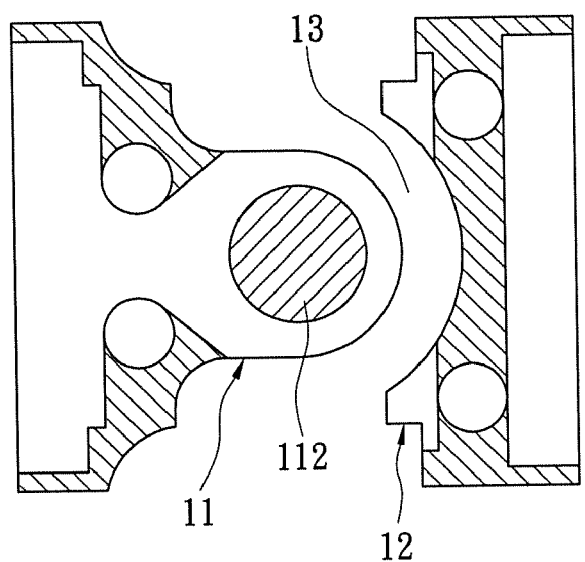
FIG. 4A is a top view showing an etched metal substrate (closed type) according to the instant disclosure.
Figure 4B:
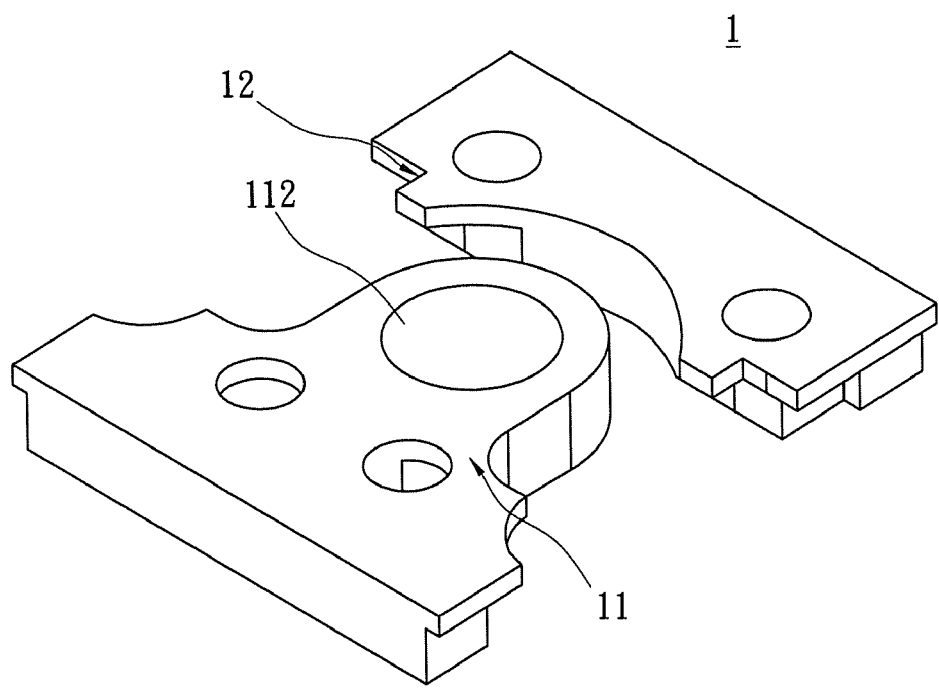
FIG. 4B is a perspective view showing the etched metal substrate shown in FIG. 4A.

Referring to FIGS. 4A and 4B, the etched metal substrate 1 has a closed configuration, according to the instant disclosure. The metal substrate 1 has a first terminal 11, a second terminal 12, and a trench 13 arranged between the first terminal 11 and the second terminal 12. The recess 112 is closed on the four inner surfaces thereof (such a recess is called a "closed type").

Figure 5A:
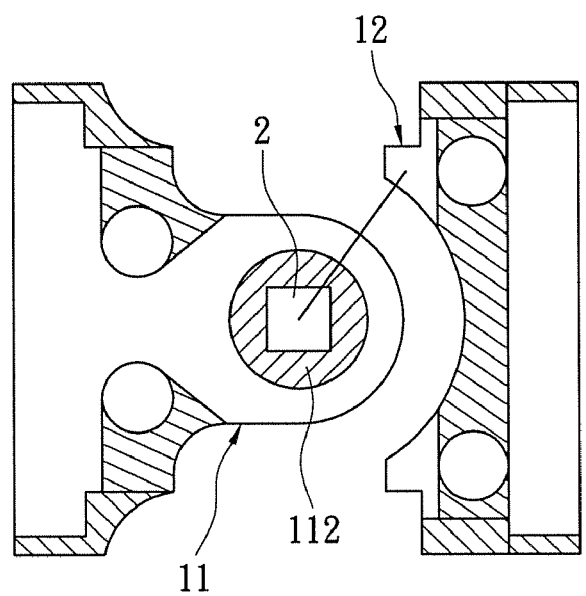
FIG. 5A is a top view showing a LED chip which is mounted on the metal substrate shown in FIG. 4A and bonded by a wire according to the instant disclosure.
Figure 5B:
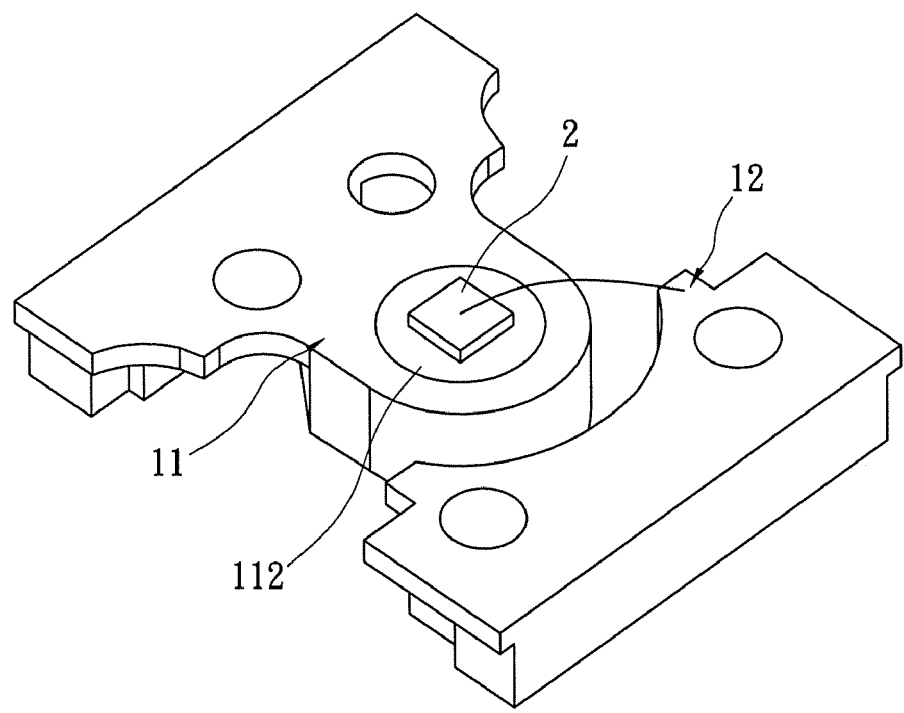
FIG. 5B is a perspective view of FIG. 5A.
Figure 6A:
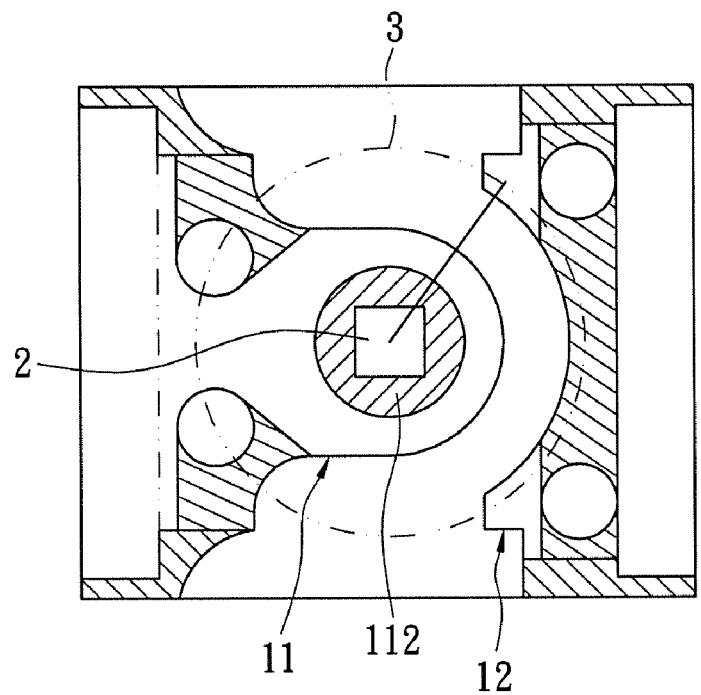
FIG. 6A is a top view showing a LED chip which is capped with encapsulate according to the instant disclosure.
Figure 6B:
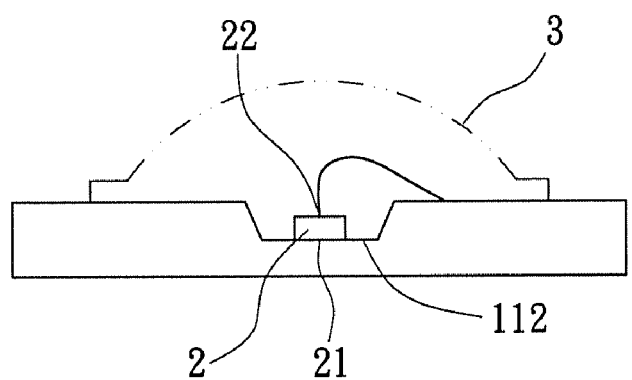
FIG. 6B is a cross-sectional view of FIG. 6A.

FIGS. 5A and 5B are respectively a top view and a perspective view showing the LED chip 2 mounted on the metal substrate shown in FIG. 4A and bonded by a wire according to the instant disclosure. The LED chip 2 is arranged in the recess 112 of the first terminal 11, and it is electrically connected with the first terminal 11 and the second terminal 12 of the metal substrate 1. Referring to FIGS. 6A and 6B, the first and the second electrodes 21, 22 of the chip 2 are arranged in the top and bottom surfaces of the chip 2. The insulative housing 3 caps the chip 2 and the substrate 1 and it is substantially a light converging element. Therefore, the package for LED can converge light.

Figure 7A:
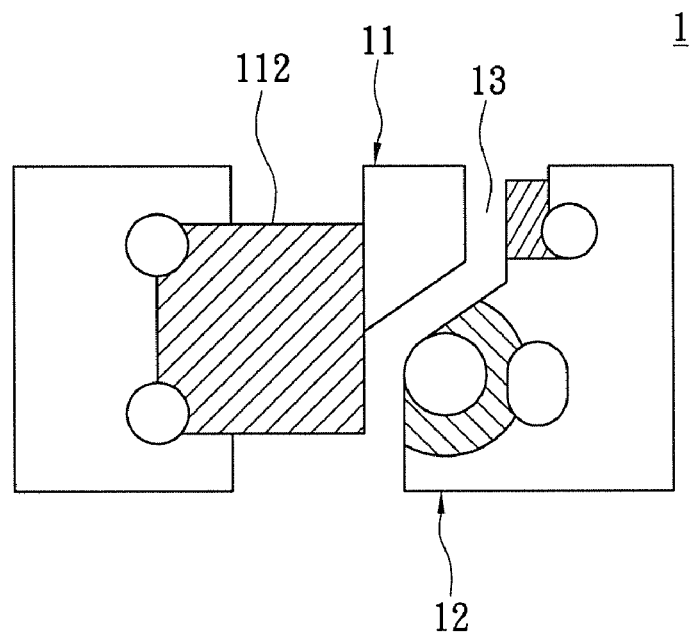
FIG. 7A is a top view showing another etched metal substrate (open type) according to the instant disclosure.
Figure 7B:
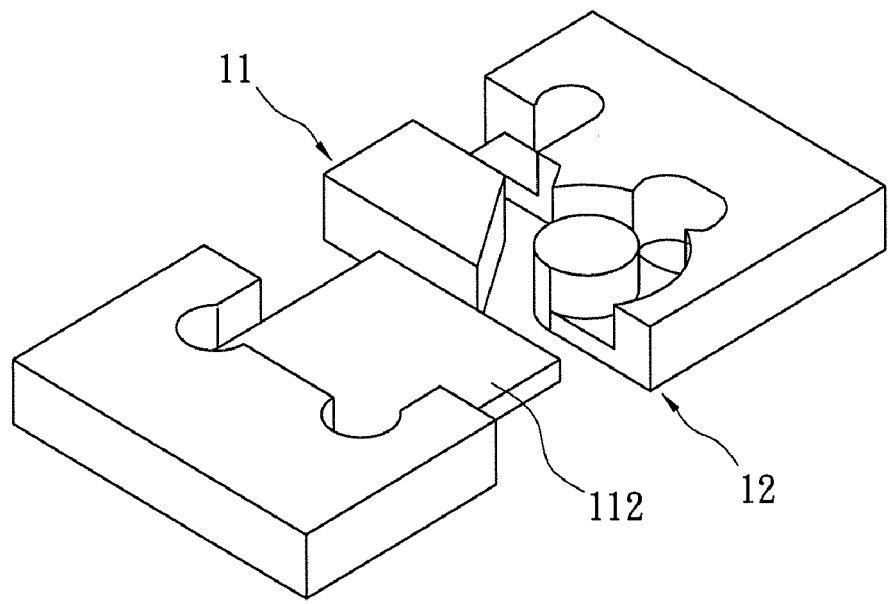
FIG. 7B is a perspective view showing the etched metal substrate shown in FIG. 7A.

Referring to FIGS. 7A and 7B, the metal substrate 1 has the first terminal 11, the second terminal 12, and the trench 13. The first terminal 11 is formed with a recess 112, and the recess 112 is closed on two inner surfaces thereof (such a recess is called an "open type").

Figure 8A:
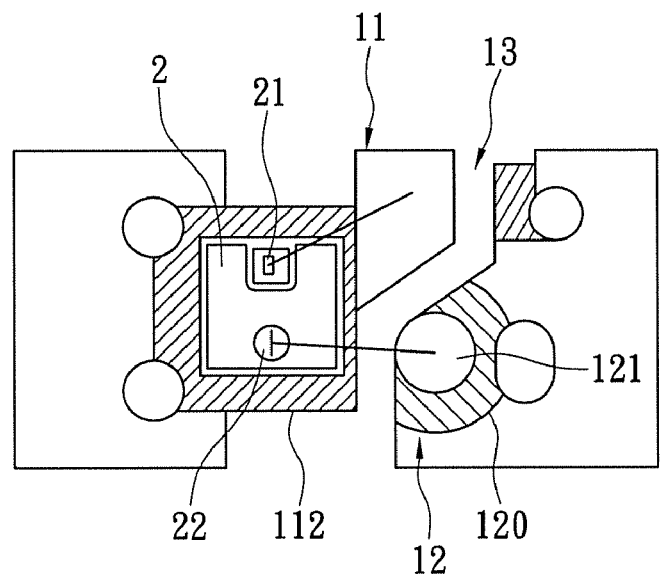
FIG. 8A is a top view showing a LED chip mounted on the metal substrate shown in FIG. 7A and bonded by wires according to the instant disclosure.
Figure 8B:
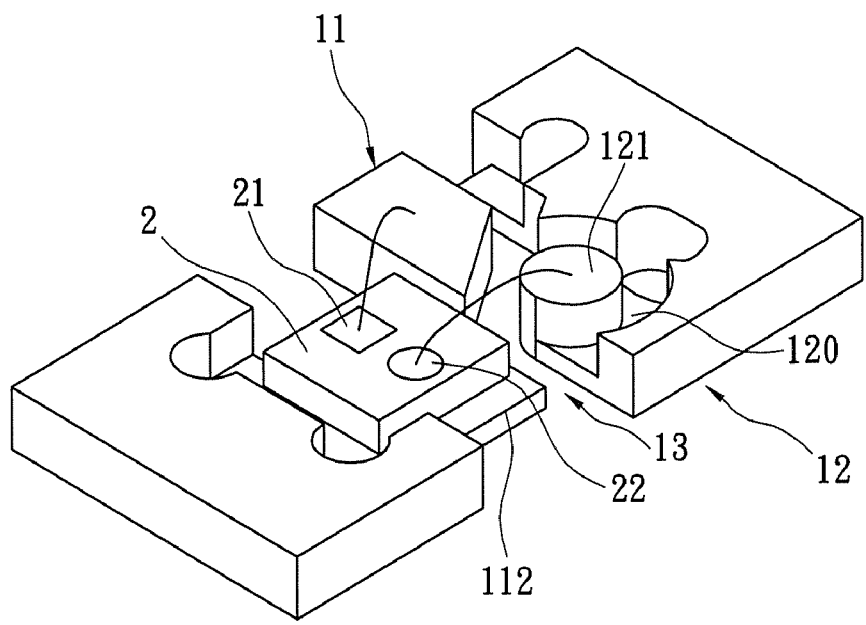
FIG. 8B is a perspective view of FIG. 8A.
Figure 9A:
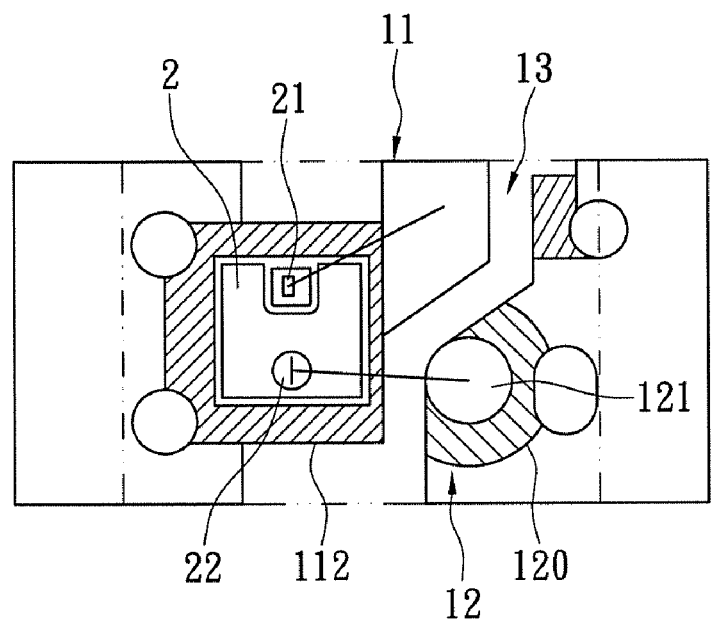
FIG. 9A is a top view showing the LED chip shown in FIG. 8A capped with encapsulate according to the instant disclosure.
Figure 9B:
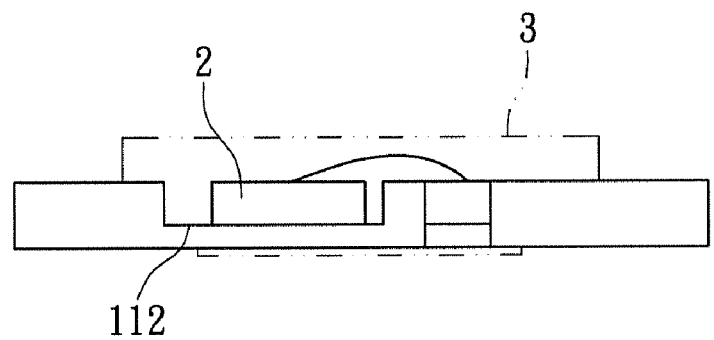
FIG. 9B is a cross-sectional view of FIG. 9A.
Figure 9C:
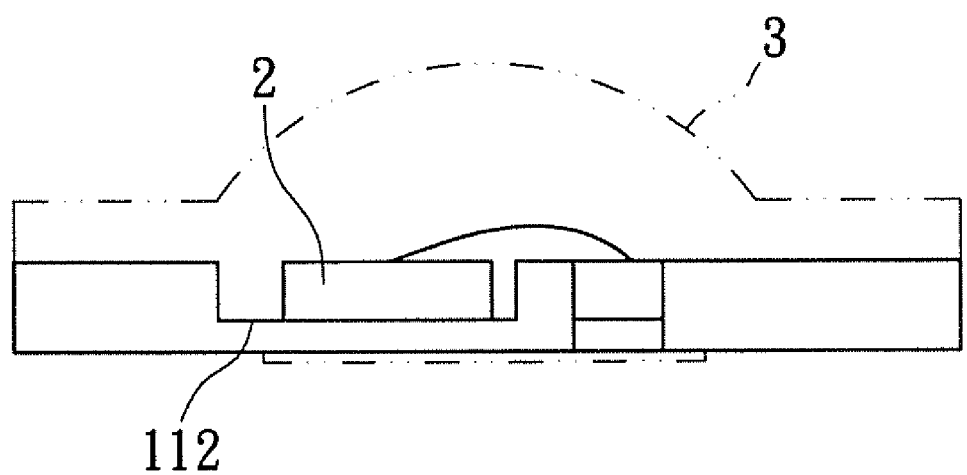
FIG. 9C is another cross-sectional view of FIG. 9A.
Figure 10:
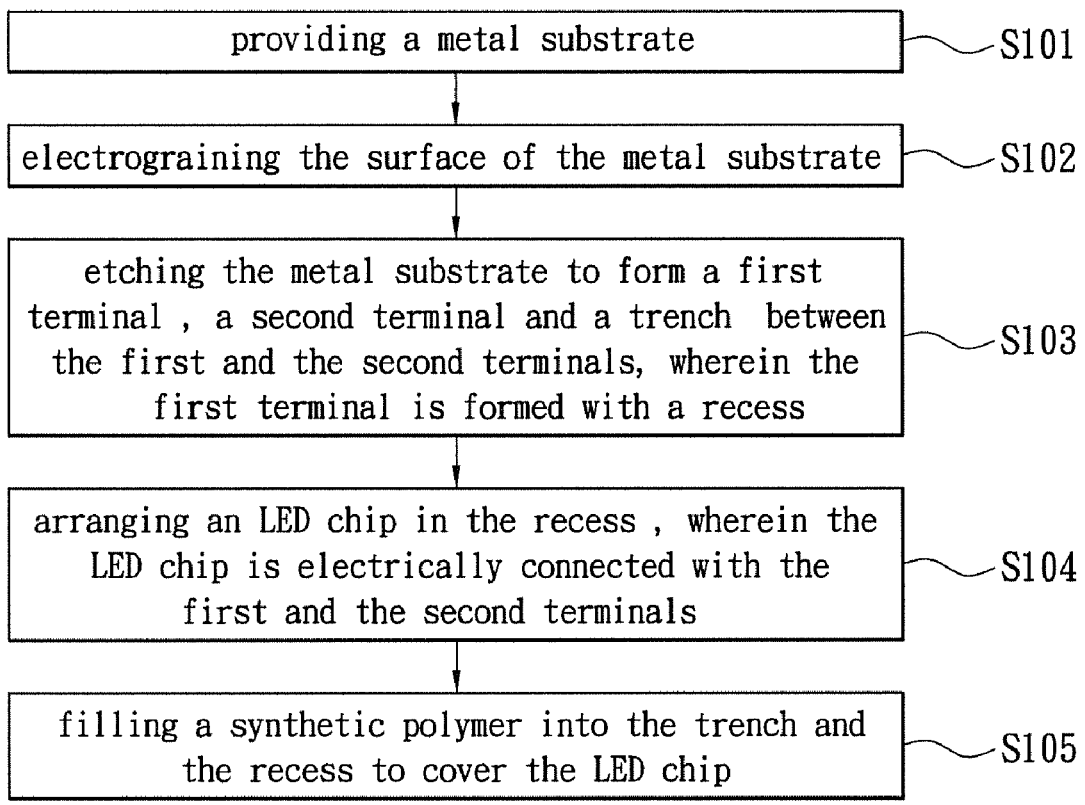
FIG. 10 is a flow chart showing a method for packaging a LED chip.

Referring to FIGS. 8A and 8B, the LED chip 2 is mounted in the recess 112 of the first terminal 11 and electrically connected with the first terminal 11 and the second terminal 12 of the metal substrate 1. Furthermore, the first electrode 21 and the second electrode 22 are arranged on the top surface of the LED chip. Referring to FIGS. 9A-9C, the insulative housing 3 caps the chip 2 and the metal substrate 1, and it is substantially a light converging element. Therefore, the whole package for the LED can converge light. Referring to FIG. 10, a method for fabricating the package for the LED comprises the following steps: (1) providing a metal substrate 1 (S101), (2) electrograining the surface of the metal substrate 1 through a chemical or blasting process (S102), (3) etching the metal substrate 1 to form a first terminal 11, a second terminal 12 and a trench 13 between the first and the second terminals 11, 12, wherein the first terminal is formed with a recess 112 (S103), (4) arranging a LED chip 2 in the recess 112, wherein the LED chip 2 is electrically connected with the first and the second terminals 11, 12 (S104), and (5) filling a synthetic polymer into the trench 13 and the recess 112 to cover the LED chip (S105), wherein the step of filling a synthetic polymer is a mold pressing process. The above process further comprises a step of capping the synthetic polymer with a light converging element.

In other words, referring to FIGS. 8A-8B and 9A-9B, the method for fabricating the light emitting diode package in the instant disclosure, comprising the following steps: providing a metal substrate 1; etching the metal substrate 1 to form a first terminal 11, a second terminal 12, and a gap 13 between the first terminal 11 and the second terminal 12, wherein the first terminal 11 has at least one first etching concave 112 concaved downwardly from the top surface thereof by etching, and the second terminal 12 has at least one second etching concave 120 concaved downwardly from the top surface thereof by etching and at least one protrusion pad 121 being close to the at least one first etching concave 112 and disposed in the at least one second etching concave 120, wherein the at least one first etching concave 112 faces the at least one second etching concave 120, and the at least one first etching concave 112 is communicated with the at least one second etching concave 120 through the gap 13; placing at least one LED chip 2 in the at least one first etching concave 112, wherein the at least one LED chip 2 has a first electrode 21 and a second electrode 22; electrically connecting the first electrode 21 with the first terminal 11 by one conductive wire, and electrically connecting the second electrode 22 with the top surface of the at least one protrusion pad 121 of the second terminal 12 by another conductive wire; and then covering the at least one LED chip 2 with synthetic polymer 3, wherein the synthetic polymer 3 is filled into the at least one first etching concave 112, the at least one second etching concave 120 and the gap 13 to connect the first terminal 11 with the second terminal 12.

When the metal substrate 1 is in contact with the synthetic polymer, the material properties of the metal substrate 1 and the cost of the equipment required by the fabricating process is reduced. Furthermore, after the metal substrate 1 is covered with the synthetic polymer, its structure becomes stronger and it is more readily cut with less burrs. Meanwhile, the fabricating process does not conflict with and can even be incorporated into the prior fabricating process since none of the machines required by the prior art needs to be changed therefore.

According to the instant disclosure, the metal substrate 1 is etched to be formed with the recess 112 for accommodating the LED chip 2. The recess 112 can be either closed on the four, three or two inner surfaces thereof, and the recess 112 can be formed in any desired shape to reduce the size of the entire LED package.

The instant disclosure has the following advantages: (1) the metal substrate 1 has good mechanical properties, (2) the metal substrate can be readily cut with less burrs, (3) the cost of equipment required by the fabricating process can be reduced, (4) the fabricating process can be conducted together with the original one, (5) the package for the LED can be reduced in size, and 6) the package for the LED can converge light.

Although the instant disclosure has been described with reference to the foregoing preferred embodiments, it will be understood that the invention is not limited to the details thereof. Various equivalent variations and modifications can still be occurred to those skilled in this art in view of the teachings of the instant disclosure. Thus, all such variations and equivalent modifications are also embraced within the scope of the invention as defined in the appended claims.

What is claimed is:

1. A method for fabricating a light emitting diode package, comprising the steps of:
   providing a metal substrate;
   etching the metal substrate to form a first terminal, a second terminal, and a gap between the first terminal and the second terminal, wherein the first terminal has at least one first etching concave concaved downwardly from the top surface thereof by etching, and the second terminal has at least one second etching concave concaved downwardly from the top surface thereof by etching and at least one protrusion pad being close to the at least one first etching concave and disposed in the at least one second etching concave, wherein the at least one first etching concave faces the at least one second etching concave, and the at least one first etching concave is communicated with the at least one second etching concave through the gap;

placing at least one LED chip in the at least one first etching concave, wherein the at least one LED chip has a first electrode and a second electrode;

electrically connecting the first electrode with the first terminal, and electrically connecting the second electrode with the top surface of the at least one protrusion pad of the second terminal by a conductive wire; and covering the at least one LED chip with synthetic polymer, wherein the synthetic polymer is filled into the at least one first etching concave, the at least one second etching concave and the gap to connect the first terminal with the second terminal.

2. The method according to claim 1, wherein before the step of etching the metal substrate, the method further comprising: electrograining the surface of the metal substrate by a chemical process or a blasting process.

3. The method according to claim 1, wherein the step of covering the at least one LED chip with the synthetic polymer is a mold pressing process.

4. The method according to claim 1, wherein one part of the bottom surface of the first terminal and one part of the bottom surface of the second terminal are covered by the synthetic polymer.

5. The method according to claim 1, wherein the first electrode is electrically connected with the top side of the first terminal by another conductive wire.

6. The method according to claim 1, wherein the first terminal has at least one protrusion pad being close to the at least one second etching concave and disposed in the at least one first etching concave.

7. The method according to claim 6, wherein the first electrode is electrically connected with the top side of the at least one protrusion pad of the first terminal by another conductive wire.

8. The method according to claim 1, wherein the first terminal has a lumpy surface in the first etching concave, and the second terminal has a lumpy surface in the second etching concave.

* * * * *